US008754416B2

(12) United States Patent
Kwok et al.

(10) Patent No.: US 8,754,416 B2
(45) Date of Patent: Jun. 17, 2014

(54) METHOD FOR FABRICATION OF ACTIVE-MATRIX DISPLAY PANELS

(75) Inventors: Hoi-Sing Kwok, Hong Kong (CN); Man Wong, Hong Kong (CN); Zhiguo Meng, Hong Kong (CN); Dongli Zhang, Hong Kong (CN); Jiaxin Sun, Hong Kong (CN); Xiuling Zhu, Hong Kong (CN)

(73) Assignee: The Hong Hong University of Science and Technology, Hong Kong (CN)

( * ) Notice: Subject to any disclaimer, the term of this patent is extended or adjusted under 35 U.S.C. 154(b) by 504 days.

(21) Appl. No.: 11/604,094

(22) Filed: Nov. 24, 2006

(65) Prior Publication Data

US 2008/0203394 A1 Aug. 28, 2008

Related U.S. Application Data

(60) Provisional application No. 60/739,160, filed on Nov. 25, 2005.

(51) Int. Cl.
*H01L 31/036* (2006.01)

(52) U.S. Cl.
USPC .......... 257/66; 257/59; 257/72; 257/E29.273; 349/43; 349/114

(58) Field of Classification Search
USPC ......................... 257/59, 72, 69, 66
See application file for complete search history.

(56) References Cited

U.S. PATENT DOCUMENTS

| 4,822,749 | A | * | 4/1989 | Flanner et al. | 438/622 |
|---|---|---|---|---|---|
| 4,937,657 | A | * | 6/1990 | DeBlasi et al. | 257/412 |
| 5,471,330 | A | * | 11/1995 | Sarma | 349/43 |
| 5,705,829 | A | | 1/1998 | Miyanaga et al. | |
| 6,004,831 | A | * | 12/1999 | Yamazaki et al. | 438/30 |
| 6,025,605 | A | | 2/2000 | Lyu | |
| 6,160,270 | A | * | 12/2000 | Holmberg et al. | 257/59 |
| 6,191,476 | B1 | * | 2/2001 | Takahashi et al. | 257/706 |
| 6,365,916 | B1 | | 4/2002 | Zhong et al. | |
| 6,573,169 | B2 | * | 6/2003 | Noble et al. | 438/592 |
| 6,737,674 | B2 | | 5/2004 | Zhang et al. | |
| 7,186,664 | B2 | | 3/2007 | Ahn et al. | |
| 2002/0009833 | A1 | * | 1/2002 | Lin et al. | 438/142 |
| 2003/0129853 | A1 | | 7/2003 | Nakajima et al. | |
| 2004/0099864 | A1 | * | 5/2004 | Kong et al. | 257/72 |
| 2005/0023707 | A1 | | 2/2005 | Ahn et al. | |
| 2005/0035352 | A1 | * | 2/2005 | Onizuka | 257/72 |
| 2005/0059190 | A1 | * | 3/2005 | Lee et al. | 438/149 |
| 2005/0237070 | A1 | | 10/2005 | Kazama | |
| 2005/0260804 | A1 | * | 11/2005 | Kang et al. | 438/164 |
| 2007/0007579 | A1 | * | 1/2007 | Scheuerlein et al. | 257/315 |
| 2009/0166742 | A1 | * | 7/2009 | Pillarisetty et al. | 257/365 |
| 2009/0283840 | A1 | * | 11/2009 | Coolbaugh et al. | 257/379 |

FOREIGN PATENT DOCUMENTS

| EP | 0348209 | 12/1989 |
|---|---|---|
| JP | 200177047 A | 3/2001 |
| JP | 2004172179 | 6/2004 |
| JP | 2004207598 | 7/2004 |

* cited by examiner

*Primary Examiner* — Minh-Loan T Tran
*Assistant Examiner* — Fazli Erdem
(74) *Attorney, Agent, or Firm* — Leydig, Voit & Mayer, Ltd.

(57) ABSTRACT

The present invention provides a method of an active-matrix thin film transistor array, comprising of two levels of metallic interconnections formed from one layer of metallic conductor; and thin-film transistors with source, drain and gate electrodes either fully or partially replaced with metal, and wherein the pixel electrodes are polycrystalline silicon.

8 Claims, 9 Drawing Sheets

METHOD FOR FABRICATION OF ACTIVE-MATRIX DISPLAY PANELS

CROSS-REFERENCE TO RELATED APPLICATION

This application claims the benefit of U.S. Provisional Patent Application Ser. No. 60/739,160; filed Nov. 25, 2005, the entire content of which is incorporated by reference herein.

FIELD OF THE INVENTION

This invention relates to improved active matrix display panels, and more particularly to improved active matrix display panels having the same poly-Si layer as the pixel electrode and as the transistor electrode, and having some of the poly-Si island substituted by metal for the interconnection cross-over.

BACKGROUND OF THE INVENTION

The demand for high quality and high information content LCD and OLED display has been causing a switch from passive to active matrix panels. Both α-Si and poly-Si TFT are used in the construction of active-matrix panels. α-Si TFT technology is simple and mature, but poly-Si TFT can form higher quality display and integrated driver circuit and matrix together. Most companies that manufacture flat panel displays use α-Si TFT technology currently. But poly-Si TFT can be used to improve the quality of the display and can be an important technology for the future.

Manufacturing a conventional α-Si TFT active matrix display panel includes forming gate bus lines and gate electrodes on a substrate; forming a gate insulating layer on the substrate; forming a semiconductor layer on the gate insulating layer; and forming an ohmic contact layer on the semiconductor layer. Also, source bus lines, source electrodes, drain electrodes and electrodes of storage capacitors are formed on the ohmic contact layer. A first passivation layer covers the storage capacitors, the drain electrodes, the semiconductor layer, the source bus lines and the source electrodes; and a second passivation layer covers the first passivation layer and the substrate. Contact holes formed in the first and second passivation layers expose the drain electrodes and the storage capacitors. Pixel electrodes are formed on the storage electrodes, the drain electrodes, the passivation layer, and the substrate. Manufacturing cost of an active-matrix panel is directly proportional to the number of masking steps required. Hence, it is desirable to reduce the number of steps involved in manufacturing these panels.

The present invention provides a much simpler fabrication process of poly-Si TFT active matrix panel for AMLCD and AMOLED, a 30-40% reduction in mask-count is possible, even when compared to that required for the production of α-Si active matrix panels (no driving circuit) used in AMLCD and AMOLED displays.

U.S. Pat. No. 6,025,605 proposes one method to reduce mask process by patterning the second metal layer and impurity-doped semiconductor layer and undoped semiconductor layer in the same step, while source and drain regions are formed in a single processing step, without any additional mask steps.

U.S. Pat. No. 6,365,916 proposes to form the color filters on the active substrate so that the filters also overlap the address lines and function as an insulating layer between the pixel electrodes and address lines in the areas of overlap. Accordingly, the patentee asserts that line-pixel capacitances are reduced and the resulting AMLCD is easier to manufacture. The total number of process step in manufacturing is reduced.

U.S. Published Patent Application No. US2005/023707 proposes aluminum-silicon substitution method to fabricate BJTs with low contact resistance. The method is also applied to form metal plug and metal wiring to reduce resistance, according to JP2004172179. There is no report on its application to parasitic resistance reduction to TFTs and 2-level interconnects formation with one metal layer. The references, patents and patent applications cited herein are incorporated by reference.

SUMMARY OF THE INVENTION

The present invention provides a technique for fabricating active-matrix display panels. The method provides replacing poly-Si with aluminum to achieve low-resistance metal interconnection and high performance TFTs with low source/drain parasitic resistance; and (2) employing poly-Si as pixel electrodes for AMLCD and AMOLED.

By combining the techniques listed above, the pixel electrode, poly-Si island for the interconnection cross-over and the active layers of TFTs are of the same poly-Si layer and patterned through one photolithography step, thus deposition and patterning of ITO layer can be eliminated. As well interconnection cross-over conventionally using two metal layers can be replaced with one metal layer. TFT gate insulating layer, insulating layer separating overlapping interconnections and contact windows are patterned through a second photolithography step; source/drain and gate metal electrodes of the TFTs can be formed from one metal layer through a third photolithography step. The above three photolithography steps are all that are required for forming active-matrix display panels. Conventional display panel fabrication techniques based on poly-Si or α-Si, 2-3 masks, are eliminated. Accordingly, the production yield will be increased and the production cost can be lowered.

BRIEF DESCRIPTION OF THE FIGURES

Further features, objects and advantages of the invention will become apparent upon review of the following detailed description of the preferred embodiments, taken in conjunction with the accompanying drawings, in which.

DETAILED DESCRIPTION THE PREFERRED EMBODIMENTS

Figure 1:
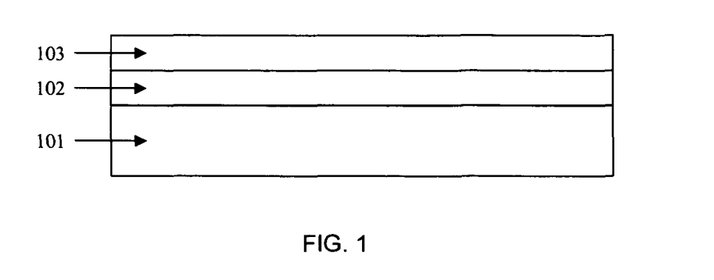
FIG. 1. is a cross-sectional schematic drawing of a thin film transistor, showing the poly-Si island for the interconnection cross-over and poly-Si pixel electrode in accordance with the present invention after formation of precursor poly-Si layer on glass substrate covered with an insulating layer.

As shown in FIG. 1a, 20 nm to 1000 nm α-Si layer 103 is deposited on a glass substrate 101 covered with an insulating buffer layer 102. Layer 103 is subsequently crystallized to form poly-Si using one of a variety of techniques, such as solid-state crystallization, excimer laser crystallization or metal-induced crystallization. Other techniques commonly employed for crystallization of silicon and known to those ordinary skill can also be used.

Figure 2A:
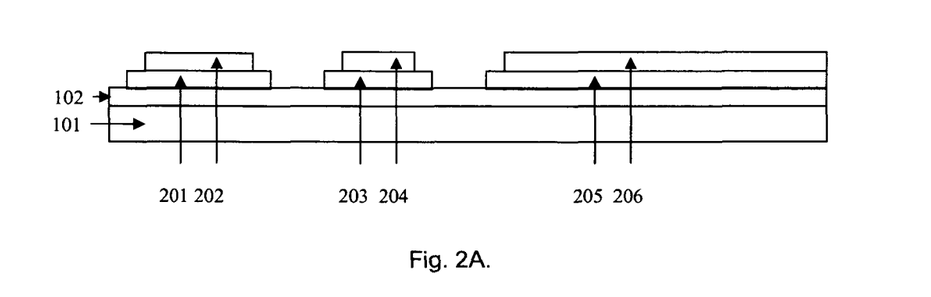
FIG. 2A is a cross-sectional view of the thin film transistor, showing the poly-Si island for the interconnection cross-over and poly-Si pixel electrode of FIG. 1, after patterning the insulating layer into islands.

As shown in FIG. 2A, transistor active islands 201, poly-Si island 203 for the interconnection cross-over and poly-Si pixel electrode 205 are patterned using standard photolithography and etching. This is followed by the deposition of a 2 nm to 300 nm insulating layer. Such an insulating layer could be formed using either a physical or a chemical vapor deposition technique. The insulating layer is patterned after a second step of photolithography and etching, forming a gate dielectric layer 202 of a transistor, an inter-level insulator 204 separating two levels of interconnections and an insulating layer 206 covering the poly-Si electrode.

Figure 2B:
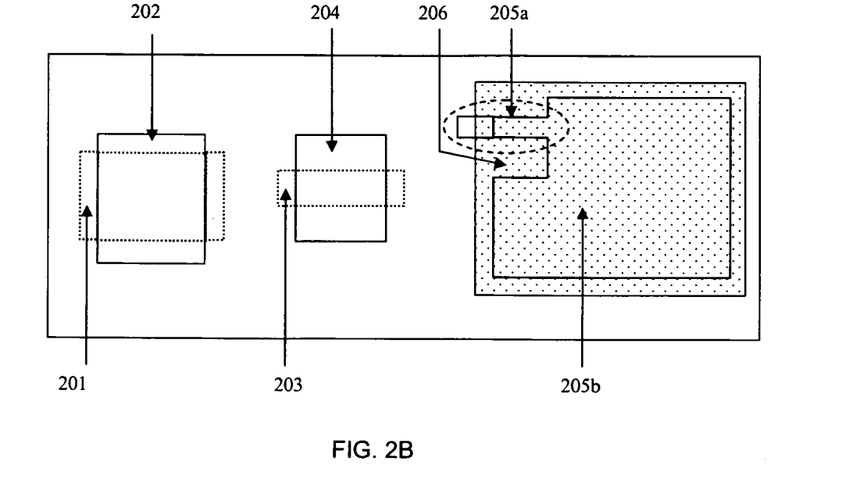
FIG. 2B is a plan view of the thin film transistor of FIG. 1 after patterning the deposited insulating layer into islands for a 5μ design rule.

A typical layout is shown in FIG. 2B. For a technology with a 5 μm design rule, the poly-Si island 201 is minimally 5 μm wider than the gate dielectric island 202 on each horizontal side, and the gate dielectric island 202 is minimally 5 μm wider than the poly-Si active island 201 on each vertical side. The interconnection cross-over poly-Si 203 is minimally 5 μm wider than the inter-level insulator 204 on each horizontal side, and the inter-level insulator 204 is minimally 5 μm wider than the interconnection cross-over poly-Si 203 on each vertical side. The left edge of a portion 205a of the poly-Si electrode is minimally 5 μm wider than the gate dielectric island 206. The rest 206b is covered by the gate dielectric.

Figure 3:
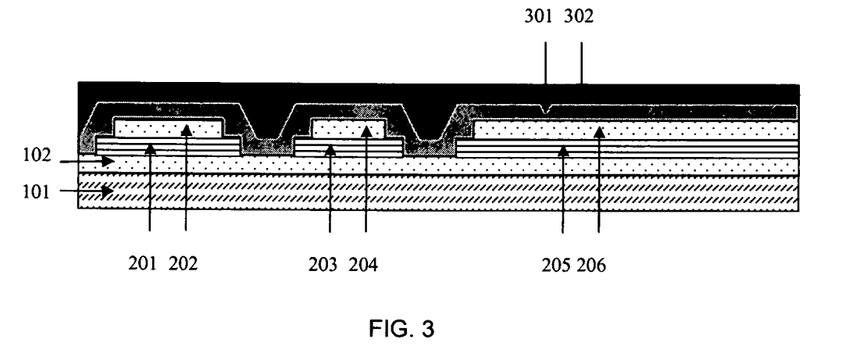
FIG. 3 is a cross-sectional view of the thin film transistor of FIG. 1 after formation of the Ti and Al layer.
Figure 4:
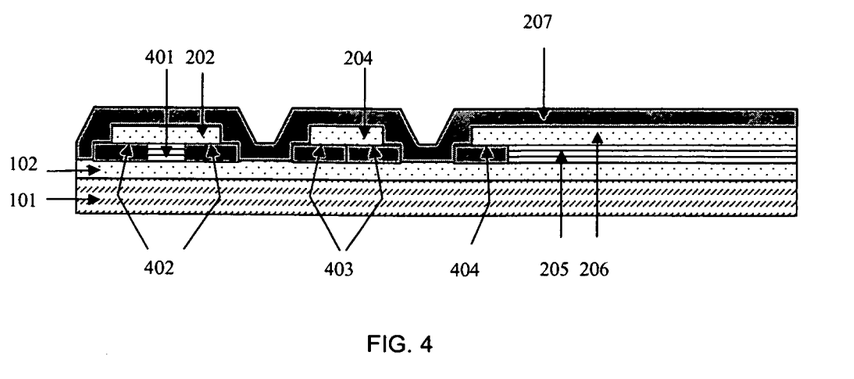
FIG. 4 is a cross-sectional view of the thin film transistor of FIG. 1 after aluminum silicon replacement process.
Figure 5A:
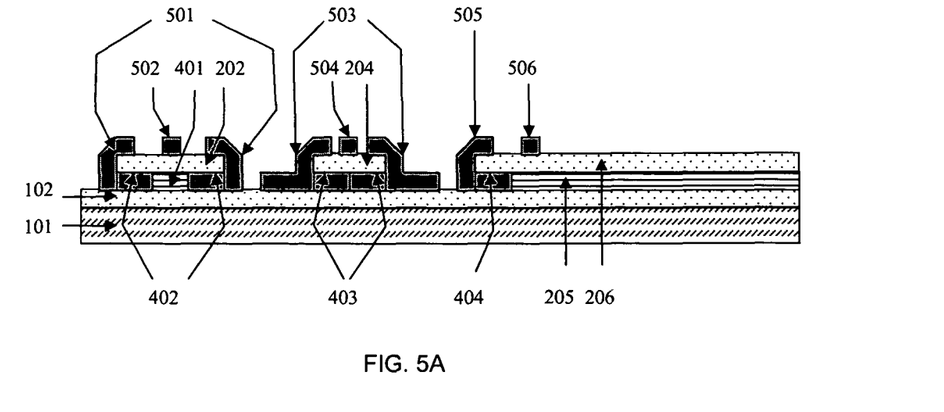
FIG. 5a is a cross-sectional view of the thin film transistor of FIG. 1 after patterning the layer into source/drain gate electrodes and metal lines.
Figure 5B:
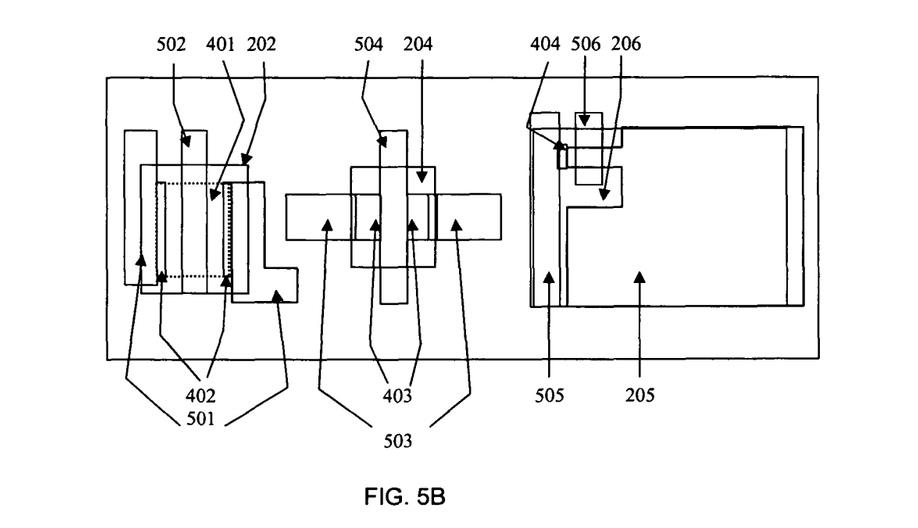
FIG. 5b is a plain view of the thin film transistor of FIG. 1 after patterning the A$_1$ layer into source/drain electrodes and metal lines.

As shown in FIG. 3, 0.2-3 μm thick aluminum (Al) layer 301 and 20-1000 nm thick titanium (Ti) layer 302 are sequentially sputtered, covering the surface of the substrate. At a temperature of 350° C.-500° C. in an inert atmosphere, and starting from the initial interface between the poly-Si and the Al/Ti stack, poly-Si is replaced with Al as the heat-treatment process proceeds. The length of the Al regions 402, 403 and 404 in FIG. 4 is determined by that of the heat treatment time. The top Ti-containing layer is optionally removed after the heat treatment.

Figure 6:
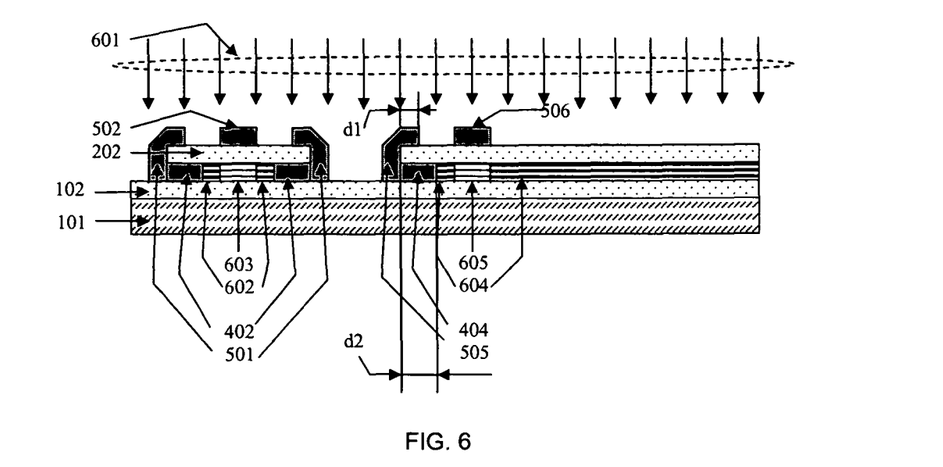
FIG. 6 is a cross-sectional view showing the introduction of boron into source/drain regions of TFTs and pixel electrodes.
Figure 7:
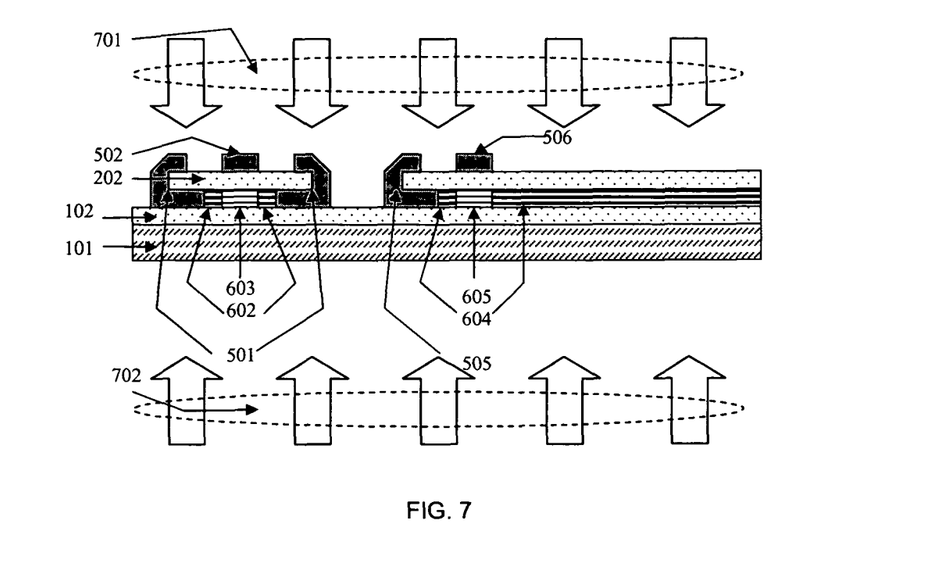
FIG. 7 is a cross-sectional view showing the activation of introduced impurities by layer or flash lamps.
Figure 8:
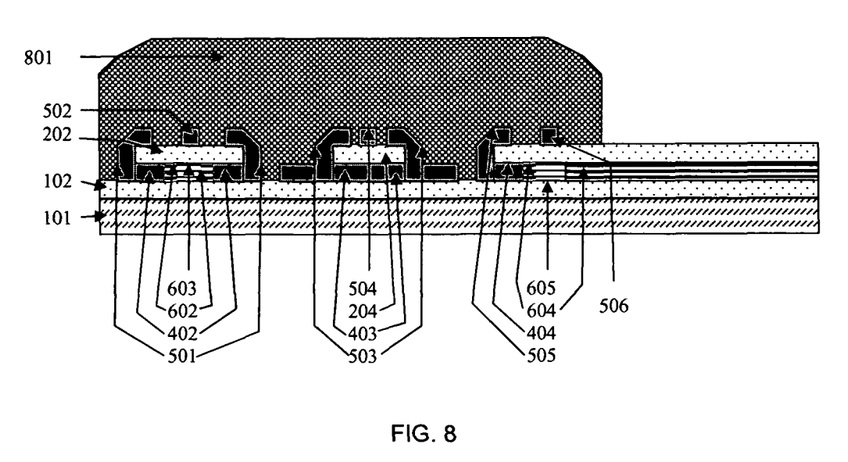
FIG. 8 is a cross-sectional view showing the exposure of LTO on one pixel electrode.
Figure 9:
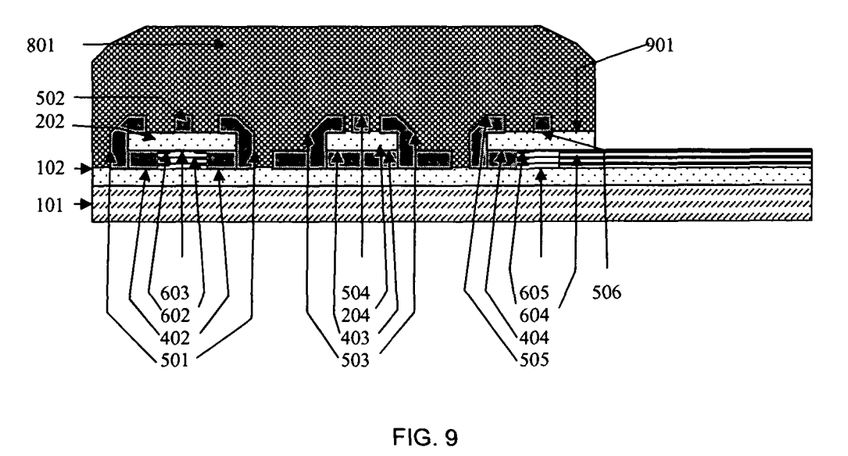
FIG. 9 is a cross-sectional view showing optional removal of LTO on one pixel electrode.
Figure 10:
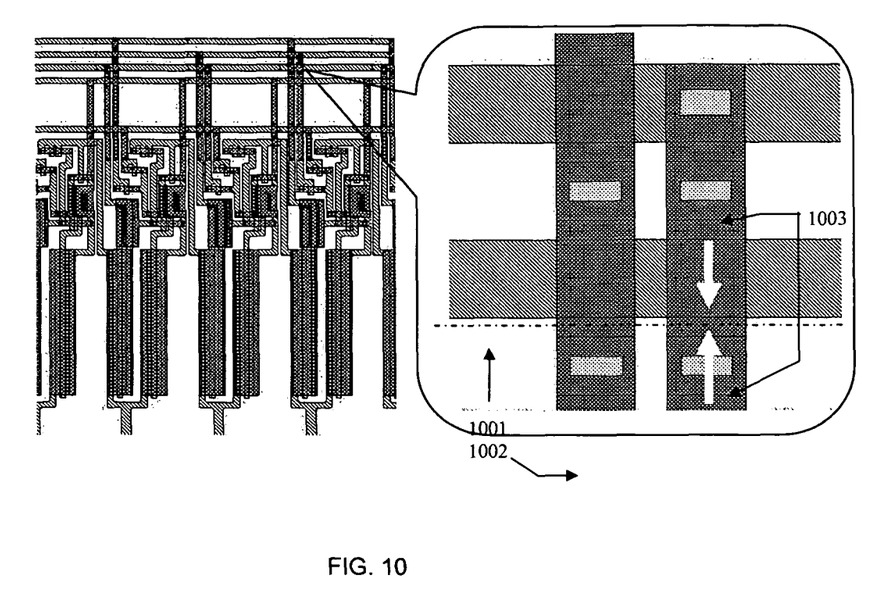
FIG. 10 is a layout of data driver circuit fabricated by the proposed 3-mask process, enlarged is the layout of the crossing metal interconnections.

The source and drain interconnection 501/505, the gate 502/506 and the interconnections 503 and 504 (FIG. 5) are also patterned using standard photolithography and etching. For the interconnection cross-over, the entire poly-Si under the insulating layer is replaced by Al 403. As shown in FIG. 6, the remaining portions of TFT source and drain region 604/602 can be doped heavily using a variety of techniques such as ion implantation. As shown in FIG. 7, implanted impurities can be rapidly activated using a laser or a flash lamp to avoid any further substitution of poly-Si by Al. The TFT channel region 603/605 can also be annealed if the irradiation is introduced from the back side. The entire panel is next covered with a protective layer 801, as shown in FIG. 8. The insulating layer on the pixel electrode is optionally removed using the protective layer 801 as an etch mask, as shown in FIG. 9. FIG. 10 shows the layout of data driver circuit using the inventive 3-mask fabrication process. The signal and the power lines 1001 are made of aluminum, the cross-over electrode 1002 is formed by Al-poly-Si replacement through windows 1003.

Figure 11:
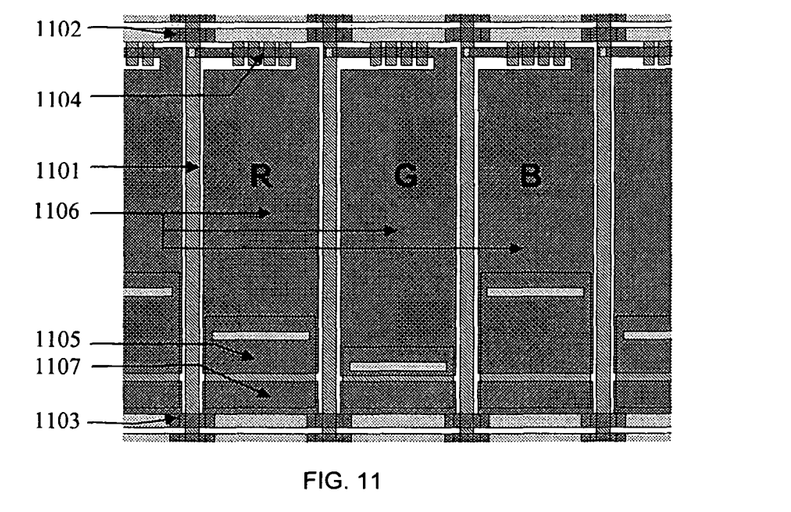
FIG. 11 is a layout of one pixel of AMLCD with 3-mask fabrication process.
Figure 12:
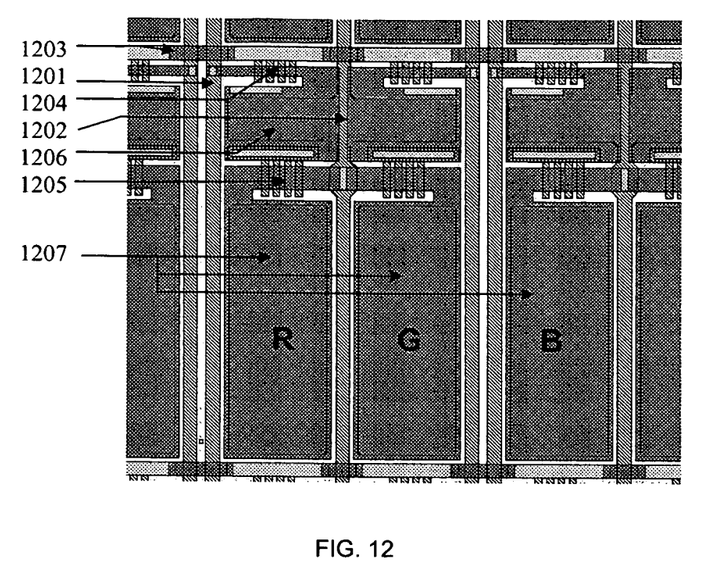
FIG. 12 is a layout of one pixel of AMOLED with 3-mask fabrication process.
Figure 13:
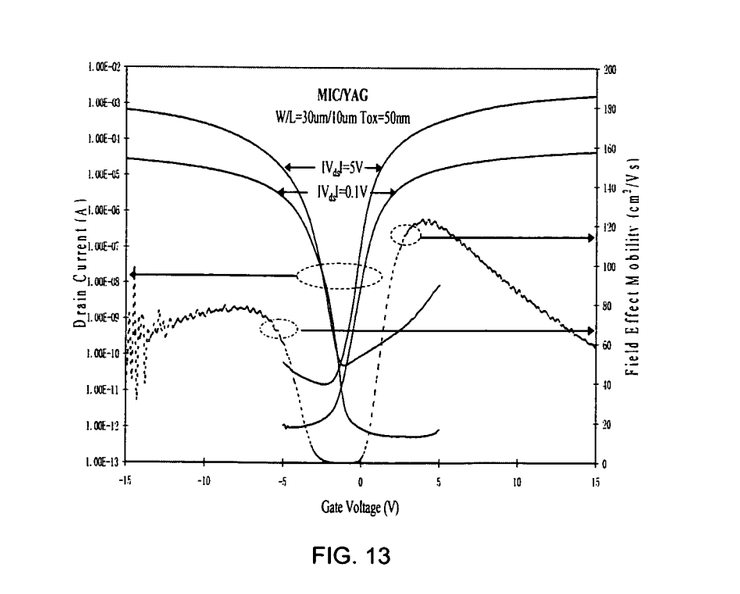
FIG. 13 is $I_d$-$V_g$ transfer curves of MIC poly-Si TFTs activated with YAG laser from backside.

FIG. 11 sets forth the layout for a pixel of an AMLCD with the 3-mask fabrication process. The data line 1101, the scan line 1102, and the common electrode line 1103 are made of aluminum. All interconnection cross-overs are all made of replacement Al. Three sub-pixels (R G B) 1106 are combined together to form one pixel. FIG. 12 illustrates the layout of a pixel of AMOLED display with the 3-masks fabrication process. The data line 1201, the scan line 1203 and the power line 1202 are made of aluminum. All interconnection cross-overs are all made of replacement Al. Three sub-pixels (R G B) 1206 are combined together to form one pixel. FIG. 13 shows the transfer characteristics of the TFTs fabricated using the inventive technique. Dopant activation and device channel annealing were performed with frequency-doubled YAG laser (532 nm) from the back side of the substrate. For the p-type TFTs, field-effect mobility is larger than 80 cm$^2$/Vs, threshold voltage is about ~3.5V, ratio of on-state and off-state currents is larger than 10$^7$.

Figure 14:
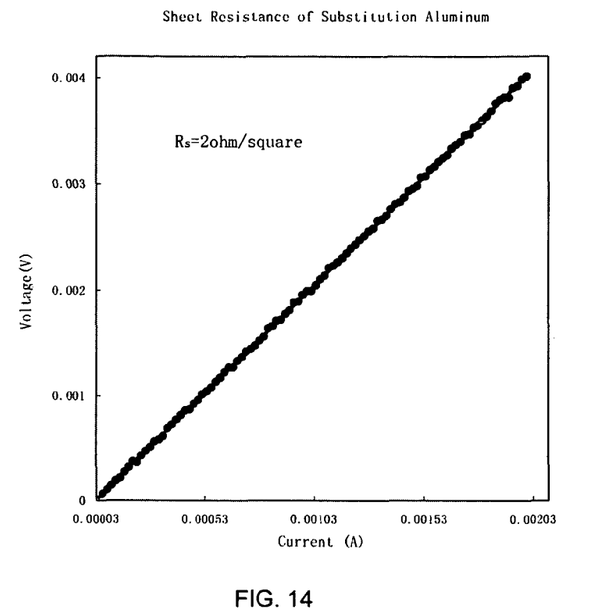
FIG. 14 is a sheet resistance measurement of substitution aluminum.
Figure 15:
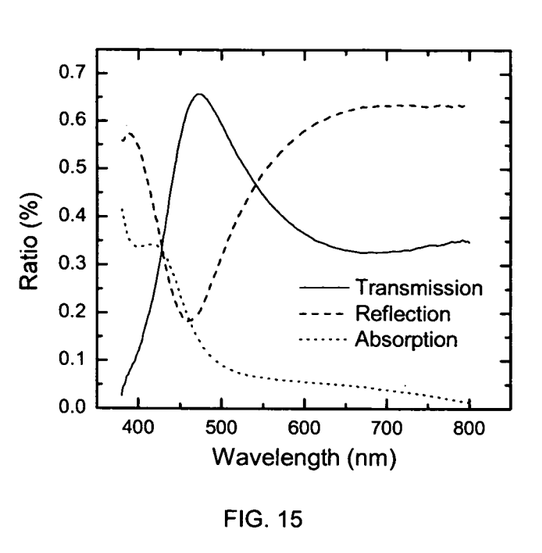
FIG. 15 is the absorption, reflection and transmission characteristics of the poly-Si pixel electrode.

Sheet resistance of the 35 nm thick aluminum film after aluminum-silicon substitution is ~2Ω as shown in FIG. 14. FIG. 15 shows the absorption, reflection and transmission characteristics of the poly-Si pixel electrode. It can be found that the absorption ratio of blue light region (460 nm) is less than 20%, and less than 10% in both green light (550 nm) and red light (640 nm) regions. The poly-Si film exhibits the characteristics of a transflective electrodes. Comparison between the proposed fabrication process and the conventional processes for poly-Si systems-on-panel is summarized in Table I. two to four below masks can be reduced.

TABLE 1

| Process | Mask 1 | Mask 2 | Mask 3 | Mask 4 | Mask 5 | Mask 6 | Mask 7 | Total |
|---|---|---|---|---|---|---|---|---|
| CMOS SOP | Active island | Gate | N+ Select | P+ Select | ITO | Contact hole | Source Drain | 7 |
| PMOS SOP | Active island | Gate | ITO | Contact hole | Source Drain | | | 5 |
| TFT | ITO | Metal gate | Active Island | Contact hole | Source Drain | | | 5 |
| Invention | Active Pixel electrode | Insulation Islands | Gate Source Drain | | | | | 3 |

Other embodiments of the invention will be apparent to those of ordinary skill in the art upon consideration of the specification and practice of the invention disclosed herein. It is therefore intended that the specification and examples be considered as exemplary only, with a true scope and spirit of the invention being indicated by the following claims.

What is claimed is:

1. An active matrix thin film transistor array, comprising:
   an interconnection cross-over including two levels of metallic interconnections of the same metal and an inter-level insulator between the two levels of metallic interconnections;
   a plurality of thin film transistors, each thin film transistor of the plurality of thin film transistors comprising:
      a channel;
      a source region comprising a metal portion, the metal portion being of the same metal as the metallic interconnections, and a semiconductor portion doped with impurities, wherein the metal portion of the source region contacts a metallic source interconnection at a first interface, the metal portion of the source region contacts the semiconductor portion of the source region at a second interface, and the semiconductor portion of the source region contacts the channel at a third interface; and
      a drain region comprising a metal portion, the metal portion being of the same metal as the metallic interconnections, and a semiconductor portion doped with impurities, wherein the metal portion of the drain region contacts a metallic drain interconnection at a fourth interface, the metal portion of the drain region contacts the semiconductor portion of the drain region at a fifth interface, and the semiconductor portion of the drain region contacts the channel at a sixth interface; and
   polycrystalline silicon pixel electrodes.

2. An active matrix thin film transistor array according to claim 1, wherein the metal of the metal portions of the source and drain regions is aluminum, silver or gold or a combination thereof.

3. An active matrix thin film transistor array according to claim 1, wherein each of the plurality of thin film transistors comprises:
   a gate electrode comprising the same metal as the source and drain regions.

4. An active matrix thin film transistor array according to claim 1, wherein the metallic source interconnection of each of the plurality of thin film transistors is of the same metal as the metallic interconnections.

5. An active matrix thin film transistor array according to claim 1, wherein the metallic drain interconnection of each of the plurality of thin film transistors is of the same metal as the metallic interconnections.

6. The active-matrix thin film transistor array of claim 1, wherein the semiconductor portion of the source and drain regions of each of the plurality of thin film transistors is of the same polycrystalline silicon as the pixel electrodes.

7. The active-matrix thin film transistor array of claim 1, wherein the metal of one of the metallic interconnections replaces a semiconductor island on one side of the inter-level insulator to electrically connect a first portion of the one of the metallic interconnections to a second portion of the one of the metallic interconnections.

8. The active-matrix thin film transistor array of claim 7, wherein the semiconductor island is of the same polycrystalline silicon as the pixel electrodes.

* * * * *